(12) United States Patent
Kurokawa

(10) Patent No.: US 7,655,560 B2
(45) Date of Patent: Feb. 2, 2010

(54) WIRING BOARD, MANUFACTURING METHOD THEREOF, SEMICONDUCTOR DEVICE AND MANUFACTURING METHOD THEREOF

(75) Inventor: Yoshiyuki Kurokawa, Kanagawa (JP)

(73) Assignee: Semiconductor Energy Laboratory Co., Ltd., Atsugi-shi, Kanagawa-Ken (JP)

( * ) Notice: Subject to any disclaimer, the term of this patent is extended or adjusted under 35 U.S.C. 154(b) by 0 days.

(21) Appl. No.: 12/203,767

(22) Filed: Sep. 3, 2008

(65) Prior Publication Data

US 2009/0004846 A1  Jan. 1, 2009

Related U.S. Application Data

(62) Division of application No. 10/910,307, filed on Aug. 4, 2004, now Pat. No. 7,423,343.

(30) Foreign Application Priority Data

Aug. 5, 2003  (JP)  ............................... 2003-287206

(51) Int. Cl.
    *H01L 21/4763* (2006.01)
(52) U.S. Cl. .................. 438/637; 438/620; 438/638
(58) Field of Classification Search ................. 438/155, 438/620, 637, 638, 639, 640, 687, 688
    See application file for complete search history.

(56) References Cited

U.S. PATENT DOCUMENTS

| 5,330,616 A | 7/1994 | Yamazaki |
| 5,440,138 A | 8/1995 | Nishi |
| 5,508,540 A | 4/1996 | Ikeda et al. |
| 5,594,569 A | 1/1997 | Konuma et al. |
| 5,880,497 A | 3/1999 | Ikeda et al. |
| 5,940,732 A | 8/1999 | Zhang |
| 6,037,197 A | 3/2000 | Yamazaki et al. |

(Continued)

FOREIGN PATENT DOCUMENTS

CN  1438703  8/2003

(Continued)

OTHER PUBLICATIONS

U.S. Appl. No. 09/649,845, filed Aug. 28, 2000 for Method of Fabricating Semiconductor Device, and Substrate Formed With Semiconductor Device (Katsumara et al.)—Specification, claims and drawings.

(Continued)

*Primary Examiner*—Kevin M Picardat
(74) *Attorney, Agent, or Firm*—Nixon Peabody, LLP; Jeffrey L. Costellia

(57) ABSTRACT

The invention provides a wiring board having a small-scale and high-performance functional circuit while realizing a multi-layer wiring with a small number of steps. In addition, the invention provides a semiconductor device in which a display device is integrated with such high-performance functional circuit on the same substrate. According to the invention, first to third wirings, first and second interlayer insulating films and first and second contact holes are formed over a substrate having an insulating surface. The second wiring is wider than the first wiring, or the third wiring is wider than the first wiring or the second wiring. The second contact hole has a larger diameter than the first contact hole.

42 Claims, 10 Drawing Sheets

U.S. PATENT DOCUMENTS

| | | | |
|---|---|---|---|
| 6,077,731 | A | 6/2000 | Yamazaki et al. |
| 6,183,937 | B1 | 2/2001 | Tsai et al. |
| 6,294,815 | B1 | 9/2001 | Yamazaki et al. |
| 6,466,303 | B1 | 10/2002 | Omura et al. |
| 6,468,844 | B1 | 10/2002 | Yamazaki et al. |
| 6,504,237 | B2 | 1/2003 | Noguchi et al. |
| 6,534,242 | B2 | 3/2003 | Sugita et al. |
| 6,556,264 | B1 | 4/2003 | Hirakata et al. |
| 6,558,881 | B2 | 5/2003 | Tokushima |
| 6,734,463 | B2 | 5/2004 | Ishikawa |
| 6,812,082 | B2 * | 11/2004 | Hirakata et al. ............. 438/680 |
| 6,835,971 | B2 | 12/2004 | Toyoshima et al. |
| 6,838,698 | B1 | 1/2005 | Yamazaki et al. |
| 6,936,847 | B2 | 8/2005 | Tanabe et al. |
| 7,009,262 | B2 | 3/2006 | Isikawa |
| 7,053,487 | B2 | 5/2006 | Saito et al. |
| 7,192,865 | B1 * | 3/2007 | Ohtani et al. ................ 438/672 |
| 7,403,238 | B2 * | 7/2008 | Higuchi et al. ................ 349/43 |
| 2001/0052950 | A1 | 12/2001 | Yamazaki et al. |
| 2002/0000551 | A1 | 1/2002 | Yamazaki et al. |
| 2002/0030189 | A1 | 3/2002 | Ishikawa |
| 2003/0080436 | A1 | 5/2003 | Ishikawa |
| 2003/0193627 | A1 | 10/2003 | Hirakata et al. |
| 2004/0256620 | A1 | 12/2004 | Yamazaki et al. |
| 2006/0118888 | A1 | 6/2006 | Isikawa |

FOREIGN PATENT DOCUMENTS

| | | |
|---|---|---|
| JP | 06-268177 | 9/1994 |
| JP | 2001-142224 | 5/2001 |
| JP | 2003-203926 | 7/2003 |

OTHER PUBLICATIONS

Qing Ma., "A four-point bending technique for studying subcritcal growth in thin films and at interfaces", J. Mater, Res., vol. 12, No. 3, Mar. 1997, pp. 840-845.

H. Ishiuchi et al., "Embedded DRAM Technologies", 1997 IEDM IEEE, Section 2.3.1. pp. 33-36.

Chinese Office Action (Application No. 200410076687.3; CN7296) Dated Mar. 7, 2008 with Full English Translation.

* cited by examiner

WIRING BOARD, MANUFACTURING METHOD THEREOF, SEMICONDUCTOR DEVICE AND MANUFACTURING METHOD THEREOF

BACKGROUND OF THE INVENTION

1. Field of the Invention

The present invention relates to a multi-layer wiring board and a manufacturing method thereof. In addition, the invention relates to a semiconductor device using the multi-layer wiring board and a manufacturing method thereof.

2. Description of the Related Art

In recent years, semiconductor devices formed by using TFTs (Thin Film Transistors) that includes polycrystalline semiconductor thin films as switching elements for a pixel portion or pixel driver circuits are actively studied and developed. Since such TFTs including polycrystalline semiconductor thin films have the advantages of high field effect mobility and the like, technologies for integrally forming a display device and a functional circuit on the same substrate are also under research and development. As for functional circuits, there are CPUs, image signal processing circuits, memories and the like. In order to improve a value of a semiconductor device, a high-performance functional circuit is required to be formed in a small area.

FIG. 8 is a mask layout of a functional circuit having a typical structure of a conventional semiconductor device using TFTs. In this case, a first wiring layer is used as a TFT gate wiring 1007 and lead wirings 1008 between TFTs while a second wiring layer is used as lead wirings 1009 between TFTs and a power supply wiring 1010. When constructing a high-performance functional circuit using wirings in two layers in this manner, the second wiring is used for wide wirings such as a power supply wiring as well as a lead wiring. Therefore, a layout area is expanded.

As a means for reducing a layout area of a functional circuit, there is a method for reducing the width of lead wirings and power supply wirings, or a method for reducing the diameter of contact holes. However, when the lead wirings and the power supply wirings are reduced in width, electric resistance is increased, leading to delays of signals or a voltage drop. This causes a malfunction of the circuit, a decrease in operating frequency and the like. In addition, when reducing the diameter of the contact holes, an electrical connection between the first wiring and the second wiring may result in a poor connection, which will cause a malfunction of the circuit. In order to form solid contact holes, a more accurate exposure system and etching system are required. However, it leads to an extraordinary cost increase. Thus, it is quite difficult to reduce the width of lead wirings and power supply wirings or reduce the diameter of contact holes.

Meanwhile, as for the development of a conventional LSI, an operating frequency has been improved by reducing a chip area using a multi-layer wiring technology in order to achieve higher performance. In the multi-layer wiring technology, specific wirings are used for a wiring for a unit cell, a wiring for each block in a functional circuit, a wiring connecting blocks, a power supply wiring, a ground wiring and the like. According to such multi-layer wiring technology, a wiring area can be reduced, and thus a chip area can be reduced. Accordingly, it is expected that the multi-layer wiring technology is efficiently applied to the manufacture of a functional circuit, which is integrated with a display device on a common substrate in view of reduction in area.

SUMMARY OF THE INVENTION

In manufacturing steps of multi-layer wirings for the LSI development, at least two additional masking steps are required for every additional wiring. In addition, a planarization step or the like is required. The planarization step for an interlayer film is performed in order to suppress the change in width of wirings due to the stepped surface of the interlayer film as well as to improve an exposure accuracy in exposure steps. As for a planarization step for the LSI development for example, CMP (Chemical Mechanical Polishing) is applied after depositing a thick interlayer film. Alternatively, a method for performing etch back after depositing an interlayer film and a flat film in this order, or a combination of the etch back with the above CMP can be employed. However, when forming multi-layer wirings over a large substrate using these methods, it is quite difficult to deposit an interlayer film with uniform thickness and to obtain flatness. Furthermore, since flatness of an upper layer reflects flatness of a lower layer, the planarization becomes even more indispensable as the number of wirings is increased, which further increases the number of manufacturing steps. Accordingly, in the case of integrally forming a functional circuit and a display device on the same substrate, it is necessary that multi-layer wirings are achieved with a small number of steps in order to provide an inexpensive device.

In view of the foregoing problems, the invention provides a wiring board and a display device having a small-scale and high-performance functional circuit while realizing multi-layer wirings with a small number of steps. In addition, the invention provides a semiconductor device in which a display device is integrated with such a high-performance functional circuit on a common substrate.

In order to solve the problems of the conventional technology as described above, the invention takes the following measures.

The invention provides a wiring board including: a first wiring formed over a substrate having an insulating surface, a first interlayer insulating film formed over the first wiring, a second wiring formed over the first interlayer insulating film, a second interlayer insulating film formed over the second wiring, a third wiring formed over the second interlayer insulating film, a first contact hole formed in the first interlayer insulating film so as to electrically connect the first wiring to the second wiring, and a second contact hole formed in the second interlayer insulating film so as to electrically connect the second wiring to the third wiring. The third wiring is wider than the first and second wirings, the second wiring is wider than the first wiring, and the second contact hole has a larger diameter than the first contact hole. In the wiring board, an area of the second contact hole is larger than an area of the first contact hole.

In the invention, a wiring is formed by patterning a wiring layer which is a conductive thin film. For example, by patterning a wiring layer formed of a metal thin film, a semiconductor thin film doped with impurities and the like, a wiring is formed. A contact hole refers to an opening formed in an interlayer insulating film for electrically connecting wirings. For example, when a first interlayer insulating film is interposed between first and second wirings, a contact hole refers to an opening formed in the first interlayer insulating film for electrically connecting the first and second wirings. In addition, the diameter of a contact hole refers to the largest one of diameters of the top end of an opening formed in an interlayer insulating film. The area of a contact hole refers to an area of a section of the top end of a contact hole.

According to the above structure, the structure that the third wiring is wider than the first and second wirings while the second wiring is wider than the first wiring means that the wiring in the upper layer which is added later is formed wider than the wiring in the lower layer. By forming the wider wiring in the upper layer in this manner, an area occupied by the wiring in the lower layer can be reduced. In addition, by forming a wide wiring such as a power supply wiring in the upper layer, the contact hole in the upper layer can be formed larger than that in the lower layer.

In addition, the invention provides a wiring board including: the first to n-th (n≧3) wirings, the first to (n−1)-th interlayer insulating films, and the first to (n−1)-th contact holes formed over a substrate having an insulating surface. The m-th interlayer insulating film is formed over the m-th (1≦m≦n) wiring, the (m+1)-th wiring is formed over the m-th interlayer insulating film, the (m+1)-th wiring is electrically connected to at least one of the first to m-th wirings through the m-th contact hole which is formed in the m-th interlayer insulating film, the p-th (2≦p≦n) wiring is wider than the r-th (1≦r≦p−1) wiring, and the s-th (2≦s≦n−1) contact hole has a larger diameter than the t-th (1≦t≦s−1) contact hole. In the wiring board, the area of the t-th contact hole is larger than the area of the s-th contact hole.

According to the wiring board having the above structure of the invention, the diameter of the s-th (2≦s≦n−1) contact hole is twice as large as or larger than twice that of the t-th (1≦t≦s−1) contact hole. In addition, at least one of the first to (n−1)-th contact holes has a diameter of 1 μm or less, and at least another one of them has a diameter of 3 μm or more. This means that among the first to (n−1)-th contact holes, the largest contact hole has a diameter of 3 μm or more while the smallest contact hole has a diameter of 1 μm or less.

According to the wiring board having the above structure of the invention, the width of the p-th (2≦p≦n) wiring is twice as much as or more than twice that of the r-th (1≦r≦p−1) wiring. In addition, at least one of the first to n-th wirings has a width of 2 μm or less, and at least another one of them has a width of 3 μm or more. This means that among the first to n-th wirings, the widest wiring has a width of 3 μm or more while the narrowest wiring has a width of 1 μm or less.

The wiring of the invention is formed of a conductive thin film, which is a film including one or more of Al, W, Mo, Ti, Pt, Cu, Ta and Au in single or multiple layers, or a semiconductor thin film doped with impurities.

According to the invention, the substrate having an insulating surface may be a glass substrate, a quartz substrate, a plastic substrate or an SOI substrate.

In addition, at least one of the wirings of the invention is used as a power supply wiring or a clock wiring. The wing in the upper layer should be a wide wiring. Alternatively, other wirings than the power supply wiring and the clock wiring may be used as long as they are wide. For example, a signal wiring for an input/output of a block, a signal wiring for an input/output portion of a functional circuit and the like are applicable.

Among the interlayer insulating films of the invention, at least one of them is formed of organic resin. An organic resin film has a lower dielectric constant than an inorganic film, which is typically used as an interlayer film. Therefore, parasitic capacitance can be reduced, leading to a higher operating rate of a functional circuit. In addition, since the interlayer insulating film containing organic resin has superior flatness at the time of deposition, a planarization step can be omitted. However, it is difficult to form a minute contact hole in an organic resin film in terms of the material characteristics in general. According to the invention, a larger contact hole can be formed in the upper layer, therefore, less restrictive conditions are given on microfabrication, and thus organic resin can be effectively used for an interlayer insulating film.

The invention provides a semiconductor device having a functional circuit including thin film transistors each using a semiconductor thin film as an active layer formed over a substrate having an insulating surface and the functional circuit includes: a first wiring, a second wiring, a third wiring, a first interlayer insulating film, a second interlayer insulating film, a first contact hole, and a second contact hole. Each of the first to third wirings is formed of a conductive thin film, the second wiring is electrically connected to the first wiring through the first contact hole formed in the first interlayer insulating film, the third wiring is electrically connected to at least one of the first wiring and the second wiring through the second contact hole formed in the second interlayer insulating film, the second wiring is wider than the first wiring or the third wiring is wider than the first wiring or the second wiring, and the second contact hole has a larger diameter than the first contact hole. In the semiconductor device, the area of the second contact hole is larger than the area of the first contact hole.

According to another structure of the invention, the above semiconductor device having a functional circuit which is formed of thin film transistors each using as an active layer a semiconductor thin film formed over a substrate having an insulating surface, further includes a display device.

According to the above structure of the invention, the diameter of the second contact hole is twice as large as or larger than twice that of the first contact hole. In addition, the first contact hole has a diameter of 1 μm or less while the second contact hole has a diameter of 3 μm or more.

According to the above structure of the invention, the width of the second wiring is twice as much as or more than twice that of the first wiring, the width of the third wiring is twice as much as or more than twice that of the first wiring, or the width of the third wiring is twice as much as or more than twice that of the second wiring. In addition, at least one of the first to third wirings has a width of 2 μm or less while at least another one of them has a width of 3 μm or more.

In addition, according to the invention, a semiconductor device having a functional circuit which is formed of thin film transistors each using a semiconductor thin film as an active layer formed over a substrate having an insulating surface and the functional circuit includes: the first to n-th (n≧3) wirings, the first to (n−1)-th interlayer insulating films, and the first to (n−1)-th contact holes. Each of the first to n-th wirings is formed of a conductive thin film, the m (2≦m≦n)-th wiring is electrically connected to at least one of the first to (m−1)-th wirings through the (m−1)-th contact hole formed in the (m−1)-th interlayer insulating film, the p (2≦p≦n)-th wiring is wider than the r-th (1≦r≦p−1) wiring, and the s-th (2≦s≦n−1) contact hole has a larger diameter than the t-th (1≦t≦s−1) contact hole. In the semiconductor device, the area of the t-th contact hole is larger than the area of the s-th contact hole.

According to the above structure of the invention, the semiconductor device having a functional circuit which is formed of thin film transistors each using as an active layer a semiconductor thin film formed over the substrate having an insulating surface, further includes a display device.

According to the above structure of the invention, the diameter of the s-th (2≦s≦n−1) contact hole is twice as much as or more than twice that of the t-th (1≦t≦s−1) contact hole. In addition, at least one of the first to (n−1)-th contact holes has a diameter of 1 µm or less while at least another one of them has a diameter of 3 µm or more.

According to the above structure of the invention, the width of the p-th ($2 \leq p \leq n$) wiring is twice as much as or more than twice that of the r-th ($1 \leq r \leq p-1$) wiring. In addition, at least one of the first to n-th wirings has a width of 2 µm or less while at least another one of them has a width of 3 µm or more.

In addition, the wiring of the invention is formed of a conductive thin film, which is a film including one or more of Al, W, Mo, Ti, Pt, Cu, Ta and Au or alloy containing at least one of the materials in a single layer or multiple layers, or a semiconductor thin film doped with impurities.

According to the invention, the substrate having an insulating surface may be a glass substrate, a quartz substrate, a plastic substrate or an SOI substrate.

In addition, at least one of the wirings of the invention is used as a power supply wiring or a clock wiring. The wiring in the upper layer should be a wide wiring. Alternatively, the wiring of the invention may be other wirings besides the power supply wiring and the clock wiring as long as they are wide. For example, a signal wiring for an input/output of a block, a signal wiring for an input/output portion of a functional circuit and the like are applicable.

Among the interlayer insulating films of the invention, at least one of them may contain organic resin. An organic resin film has a lower dielectric constant than an inorganic film which is typically used as an interlayer film. Therefore, parasitic capacitance can be reduced. In addition, since the interlayer insulating film using organic resin is superior in flatness at the time of deposition, a planarization step can be omitted, leading to a higher operating rate of a functional circuit. However, it is difficult to form a minute contact hole in an organic resin film in terms of the material characteristics in general. According to the invention, the contact hole in the upper layer can be formed large in diameter, therefore, less restrictive conditions are given on the microfabrication, and thus organic resin can be effectively used for an interlayer insulating film.

According to the invention, the display device can display images by using liquid crystal or light emitting elements.

The functional circuit of the invention is a CPU (Central Processing Unit), an a image signal processing circuit, an SRAM (Static Random Access Memory) or a DRAM (Dynamic Random Access Memory).

In addition, the invention provides electronic apparatuses using the semiconductor device according to the above structure.

The invention provides a manufacturing method of a wiring board, including the steps of: forming a first wiring over a substrate having an insulating surface, forming a first interlayer insulating film over the first wiring, forming a first contact hole in the first interlayer insulating film, forming a second wiring over the first interlayer insulating film so as to be electrically connected to the first wiring through the first contact hole, forming a second interlayer insulating film over the second wiring, forming a second contact hole in the second interlayer insulating film, and forming a third wiring over the second interlayer insulating film so as to be electrically connected to at least one of the first and second wirings through the second contact hole. The first to third wirings and the first and second contact holes are formed by the first to fifth photolithography steps respectively, and at least one of the first to fifth photolithography steps is preformed by a different exposure system from those of the other photolithography steps.

The invention provides a manufacturing method of a wiring board, including the steps of: forming the first to n-th ($n \geq 3$) wirings, the first to (n−1)-th interlayer insulating films, and the first to (n−1)-th contact holes over a substrate having an insulating surface. The m-th interlayer insulating film is formed over the m-th ($1 \leq m \leq n$) wiring, the m-th contact hole is formed in the m-th interlayer insulating film, the (m+1)-th wiring is formed over the m-th interlayer insulating film so as to be electrically connected to at least one of the first to m-th wirings through the m-th contact hole, the (m+1)-th interlayer insulating film is formed over the (m+1)-th wiring, the (m+1)-th contact hole is formed in the (m+1)-th interlayer insulating film, the (m+2)-th wiring is formed over the (m+1)-th interlayer insulating film so as to be electrically connected to at least one of the first to (m+1)-th wirings through the (m+1)-th contact hole, the first to n-th wirings and the first to (n−1)-th contact holes are formed by the first to (2n−1)-th photolithography steps respectively, and at least one of the first to (2n−1)-th photolithography steps is preformed by a different exposure system from those of the other photolithography steps.

According to the manufacturing method of a wiring board having the above structure, the exposure system which is different from the rest of the exposure systems is a system which can apply exposure with a higher resolution, a higher accuracy of position and in a narrower range of exposure as compared to the rest of the exposure systems.

The invention provides a manufacturing method of a semiconductor device having a functional circuit which is formed of thin film transistors each using a semiconductor thin film as an active layer formed over a substrate having an insulating surface and the functional circuit is manufactured by the steps of: forming a first wiring over a substrate having an insulating surface, forming a first interlayer insulating in over the first wiring, forming a first contact hole in the first interlayer insulating film, forming a second wiring over the first interlayer insulating film so as to be electrically connected to the first wiring through the first contact hole, forming a second interlayer insulating film over the second wiring, forming a second contact hole in the second interlayer insulating film, and forming a third wiring over the second interlayer insulating film so as to be electrically connected to at least one of the first and second wirings through the second contact hole. The first to third wirings and the first and second contact holes are formed by the first to fifth photolithography steps respectively, and at least one of the first to fifth photolithography steps is preformed by a different exposure system from those of the other photolithography steps.

The invention provides a manufacturing method of a semiconductor device having a functional circuit which is formed of thin film transistors each using a semiconductor thin film as an active layer formed over a substrate having an insulating surface and the functional circuit is formed by the steps of: forming the first to n-th ($n \geq 3$) wirings over a substrate having an insulating surface, the first to (n−1)-th interlayer insulating films, and the first to (n−1)-th contact holes. The m-th interlayer insulating film is formed over the m-th ($1 \leq m \leq n$) wiring, the m-th contact hole is formed in the m-th interlayer insulating film, the (m+1)-h wiring is formed over the m-th interlayer insulating film so as to be electrically connected to at least one of the first to m-th wirings through the m-th contact hole, the (m+1)-th interlayer insulating film is formed over the (m+1)-th wiring, the (m+1)-th contact hole is formed in the (m+1)-th interlayer insulating film, the (m+2)-th wiring is formed over the (m+1)-th interlayer insulating film so as to be electrically connected to at least one of the first to (m+1)-th wirings through the (m+1)-th contact hole, the first to n-th wirings and the first to (n−1)-th contact holes are formed by the first to (2n−1)-th photolithography steps respectively, and at least one of the first to (2n−1)-th photolithography steps is preformed by a different exposure system from those of the other photolithography steps.

According to the manufacturing method of a semiconductor device of the invention, the functional circuit is integrated with a display device over the same substrate.

In addition, according to the manufacturing method of a semiconductor device of the invention, the exposure system which is different from the rest of the exposure systems is a system which can apply exposure with higher resolution, higher accuracy of position and in a narrower range of exposure as compared to the rest of the exposure systems. At least one of the exposure systems may be a lens projection exposure system or a mirror projection exposure system.

In addition, according to the above structure, the exposure system used for forming each of the wirings and the contact holes of the functional circuit may be a system which can apply exposure with a higher resolution, a higher accuracy of position and in a narrower range of exposure as compared to the exposure system used for forming each of wirings and contact holes of the display device.

According to the manufacturing method of a semiconductor device of the invention having the above structure, among the first to n-th wirings, the wirings in the upper layers are formed wider than the wirings in the lower layers. In addition, among the first to (n−1)-th contact holes, the contact holes in the upper layers are formed larger in diameter than the contact holes in the lower layers.

The functional circuit according to the above structure may include a CPU, an image signal processing circuit an SRAM or a DRAM. In addition, according to the above structure, at least one of the wirings can be used as a power supply wiring or a clock wiring.

The wiring according to the above structure is formed of a film including one or more of Al, W, Mo, Ti, Pt, Cu, Ta and Au in a single layer or multiple layers, or a semiconductor thin film doped with impurities.

According to the manufacturing method of a semiconductor device of the invention having the above structure, at least one of the interlayer insulating films may contain organic resin. In addition, the substrate having an insulating surface may be a glass substrate, a quartz substrate, a plastic substrate or an SOI substrate.

According to the semiconductor device and the manufacturing method thereof of the invention, a planarization step as one of the additional steps that are required accompanied by the increased number of the wiring layers can be omitted or drastically simplified. Therefore, a multi-layer wiring of a functional circuit can be achieved at low cost. By the achievement of the multi-layer wiring, the layout area of the functional circuit can be reduced, leading to a higher operating rate and higher performance of the functional circuit. In addition, since an exposure system capable of applying exposure in a wide range can be used as the exposure system for forming the wiring in the upper layer, a functional circuit and a display device can be efficiently integrated over a large substrate. Accordingly, a high-performance functional circuit or a display device having the high-performance functional circuit can be provided inexpensively.

DETAILED DESCRIPTION OF THE INVENTION

Embodiment Mode 1

Hereinafter described are embodiment modes of the invention with reference to the accompanying drawings. It should be noted that the identical components are denoted by the identical numerals through Embodiment Modes.

Figure 2:
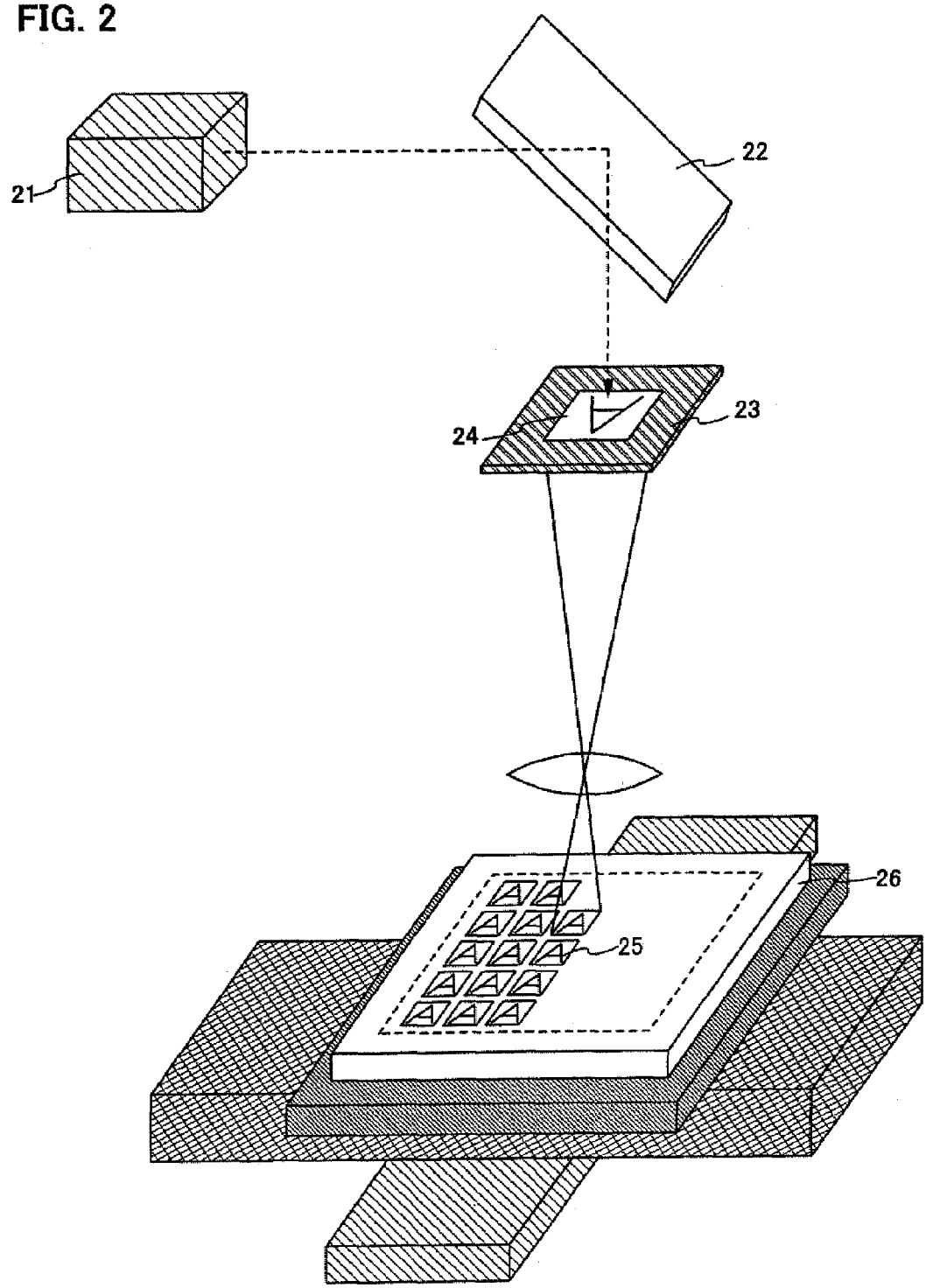
FIG. 2 illustrates a view of an exposure step by a stepper.
Figure 3:
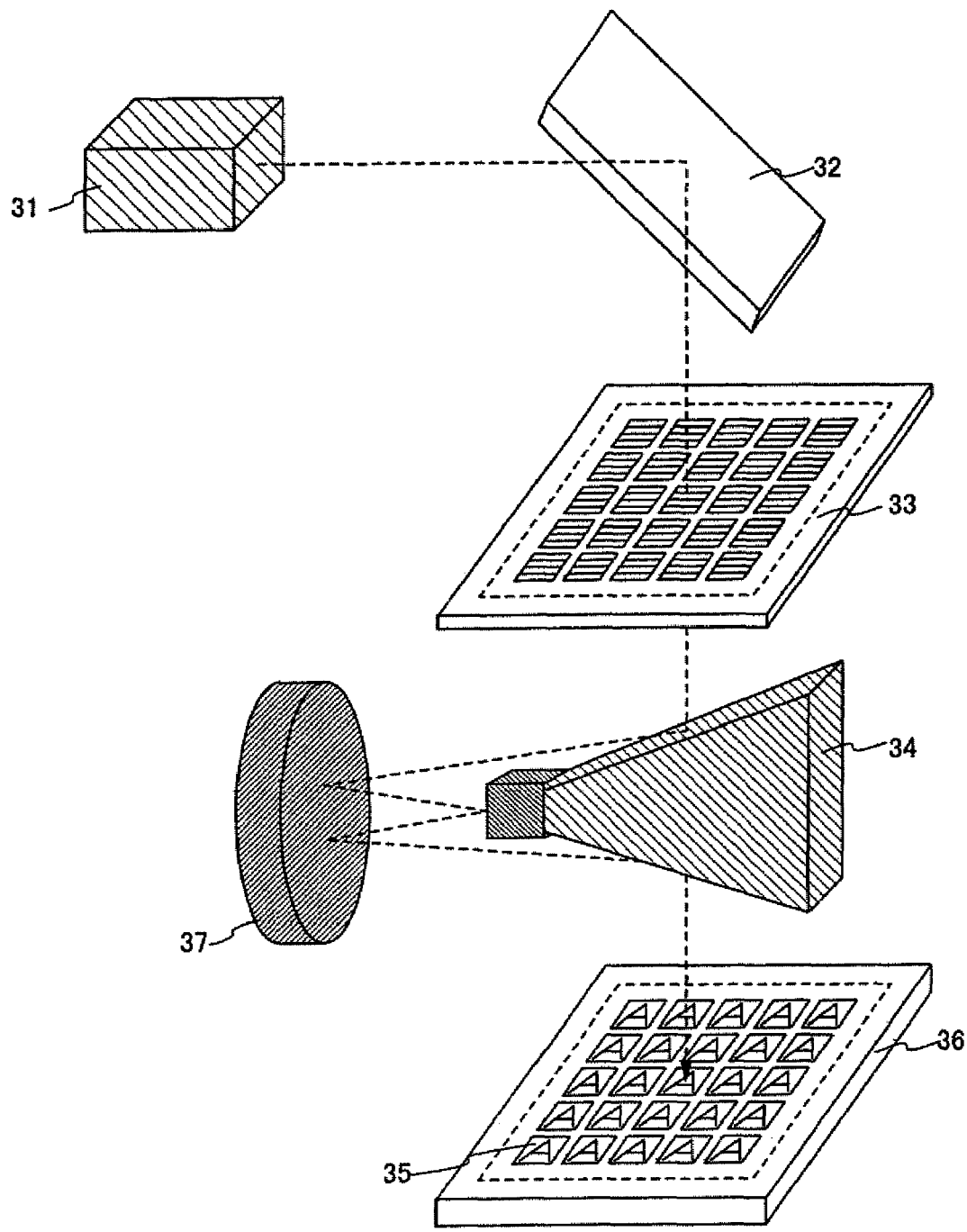
FIG. 3 illustrates a view of an exposure step by MPA.

A manufacturing method of a functional circuit of the invention is described with reference to FIGS. 1 to 3.

Figure 1A:
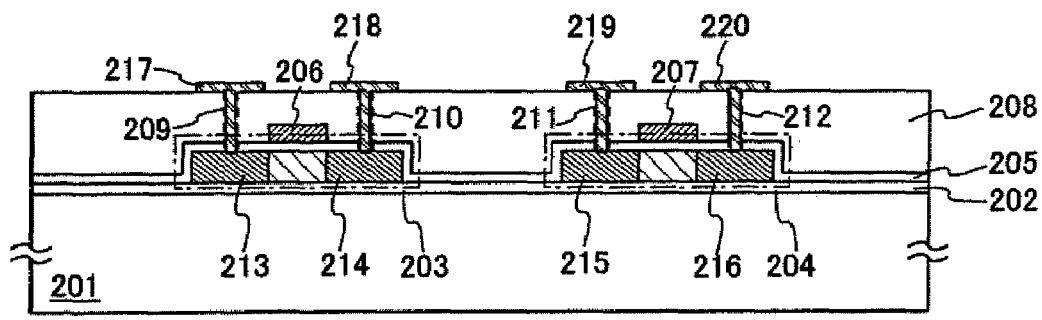
FIGS. 1A and 1B illustrate manufacturing methods of the semiconductor device of the invention.

First, a base insulating film 202 formed of an insulating film such as a silicon oxide film, a silicon nitride film or a silicon oxynitride film is formed over a substrate 201 having an insulating surface such as glass, quartz, or a resin film (FIG. 1A). The base insulating film 202 may have either a single layer structure or a multi-layer structure including the above insulating films in double layer or more.

Then, an amorphous semiconductor film is formed over the base insulating film 202. The amorphous semiconductor film is formed by a known method (sputtering, LPCVD, plasma CVD and the like). Then, the amorphous semiconductor film is crystallized by a known crystallization method such as laser crystallization, RTA, thermal crystallization using an annealing furnace, or thermal crystallization using a metal element which promotes the crystallization. A crystalline semiconductor film obtained through the above steps is patterned then into a desired shape so as to obtain semiconductor films 203 and 204.

Over the semiconductor films 203 and 204, a gate insulating film 205 is formed. As the gate insulating film 205, an insulating film such as a silicon oxide film is formed by plasma CVD or sputtering.

Over the gate insulating film 205, a conductive film is formed by a known method such as sputtering and vapor deposition. Then, the conductive film is patterned by a photolithography step using a resist pattern to obtain gate electrodes 206 and 207. In this embodiment mode, the gate electrodes 206 and 207 correspond to the first wirings.

Subsequently, the semiconductor films 203 and 204 are doped with impurities using the gate electrodes 206 and 207 as masks in order to form source regions 213 and 215 and drain regions 214 and 216. The source regions 213 and 215 and the drain regions 214 and 216 which are obtained by doping impurities into the semiconductor films also correspond to the first wiring.

Over the gate insulating film 205 and the gate electrodes 206 and 207, an insulating film such as a silicon nitride film is formed, which is used as a first interlayer insulating film 208. Accordingly, the thin film transistor is covered with the first interlayer insulating film 208.

Subsequently, the first interlayer insulating film 208 is patterned by a photolithography step to form contact holes 209 to 212 which expose the source and drain regions. As a means for the exposure in this photolithography step, an exposure system having high resolution and high accuracy of position is used. FIG. 2 schematically illustrates a view of exposure using a stepper according to this embodiment mode. First, exposure is applied by a stepper for demagnifying a pattern 24 on a reticle 23, 1/N (N>0) times using an optical system (a light source 21 and a mirror 22), and for casting the projection on a resist. The range of exposure is narrow in the case of using the stepper, therefore, a substrate 26 is repeatedly scanned to transfer a pattern 25. Since the exposure with the stepper has high accuracy, misalignment in the pattern formation hardly occurs, which enables microfabrication with high accuracy.

Then, a conductive film is formed to fill the contact holes 209 to 212 and cover the first interlayer insulating film 208 by a known method. After that, the conductive film is patterned by a photolithography step to obtain wirings 217 to 220 which are led out from the source regions 213 and 215 and the drain regions 214 and 216 through the contact holes 209 to 212. The wirings 217 to 220 on the first interlayer insulating film 208 correspond to the second wiring.

Then, over the second wiring, a photosensitive organic resin film such as polyimide and acryl is formed to be used as a second interlayer insulating film 221. Accordingly, the second wirings 217 to 220 are covered with the second interlayer insulating film 221.

The second interlayer insulating film 221 is patterned by a photolithography step to form contact holes 222 to 225. As a means for the exposure in this case, a system which can apply exposure in a wide range is preferably used rather than those having high resolution and high accuracy of position. Here, an MPA shown in FIG. 3 is used to apply exposure in a lump. First, light from a light source 31 is irradiated on a mask 33 by using a mirror 32 and the like, and then, a mask pattern 35 is projected on a resist in a lump by using a tapered mirror 34, a concave mirror 37 and the like. The MPA in general is not very high in resolution and accuracy of position as compared to the stepper, however it is capable of wide range of exposure, which is quite effective in productivity of the semiconductor device. The third wiring which is described below can be made wider than the first and second wirings, and the diameter of the contact holes can be formed large, thus conditions of exposure accuracy for the photolithography step are alleviated. Accordingly, exposure can be applied in a lump using the MPA to form contact holes.

Subsequently, a conductive film is formed to fill the contact holes 222 to 225 and cover the second interlayer insulating film 221. The conductive film is patterned then by a photolithography step to obtain wirings 226 to 229 which are led out from the second wirings 217 to 220 through the contact holes 222 to 225. The wirings 226 to 229 on the second interlayer insulating film 221 correspond to the third wiring. In this manner, a functional circuit using TFTs can be fabricated.

The method described in this embodiment is quite effective as a multi-layer wiring formation of a semiconductor device since only a small number of additional steps is required for the formation of additional wirings.

Embodiment Mode 2

Described in this embodiment mode is a manufacturing method of a functional circuit which is provided with one more wiring layer in addition to the structure in Embodiment Mode 1.

Figure 1B:
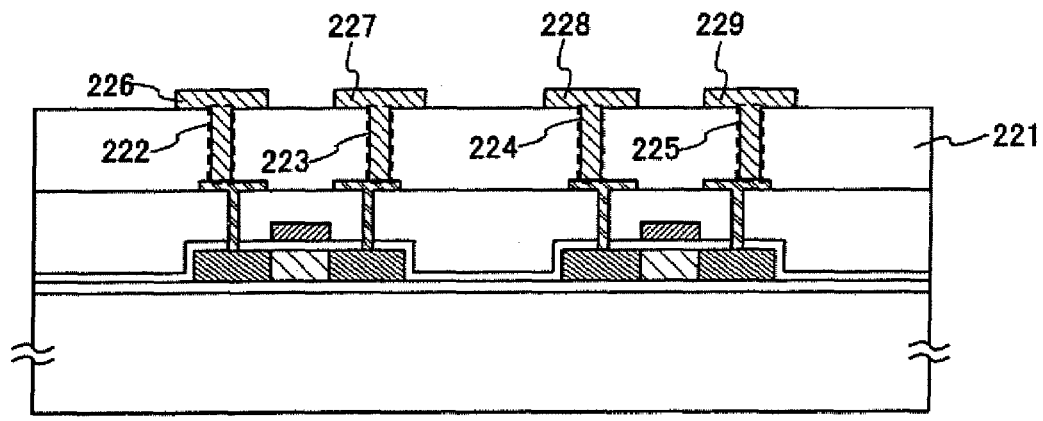

First, in accordance with Embodiment Mode 1, a functional circuit is manufactured up to the stage of FIG. 1B. Although Embodiment Mode 1 employs the MPA as an example to form the contact holes 222 to 225, the above-described stepper may be used as well to form the second contact holes in the case of obtaining minute contact holes in the second interlayer insulating film with high accuracy.

Figure 9:
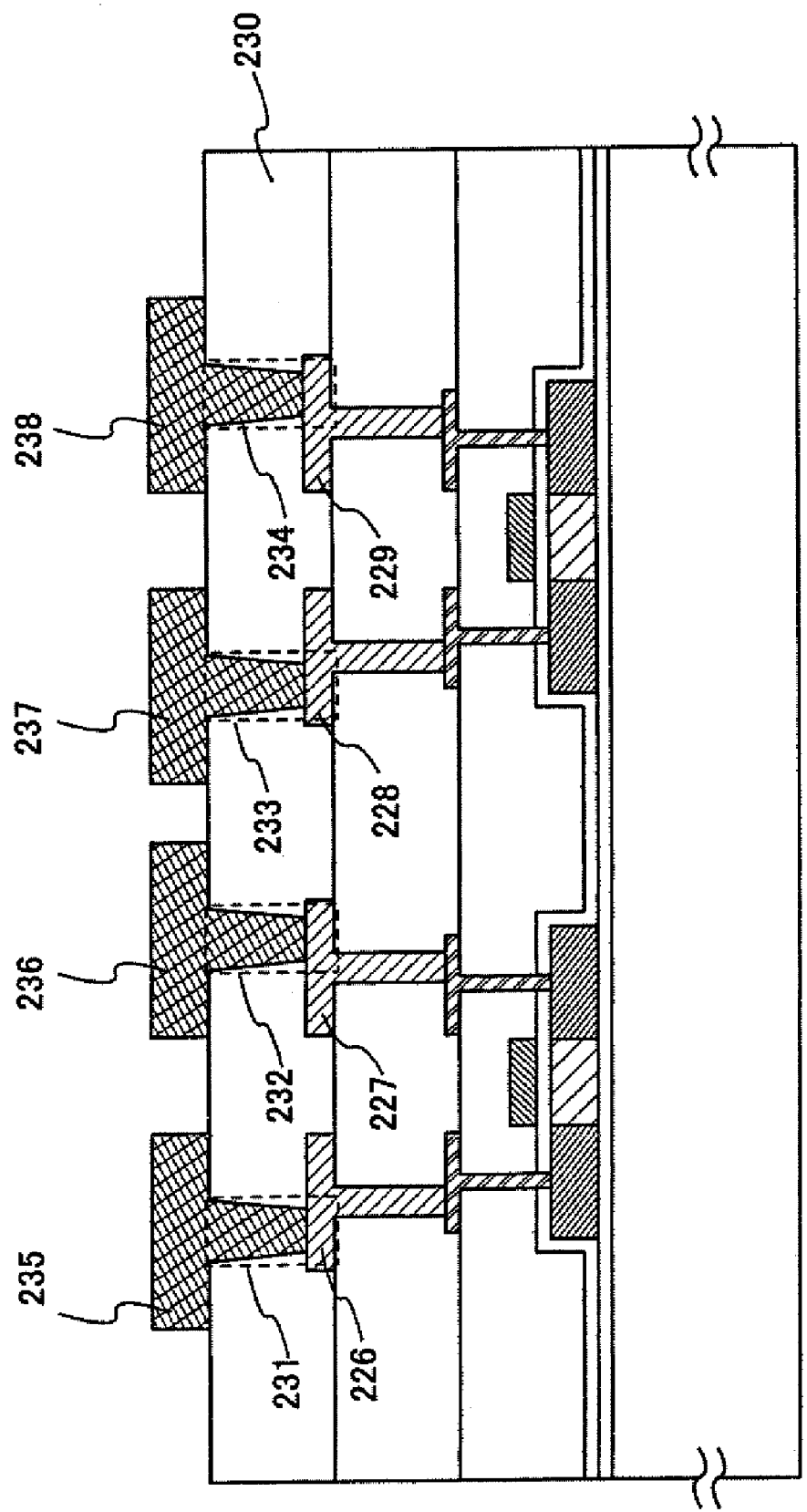
FIG. 9 illustrates a diagram of a multi-layer wiring of a semiconductor device.

In FIG. 9, a third interlayer insulating film 230 is formed over the third wirings 226 to 229 by using photosensitive organic resin such as polyimide and acryl.

The third interlayer insulating film 230 is patterned by a photolithography step to form contact holes. As a means for the exposure in this case, an MPA is used to apply exposure in a lump. The third wiring which is described below can be made wider than the lower layer wirings, and the diameter of the contact holes can be formed large, thus conditions of exposure accuracy for the photolithography step are further alleviated. Accordingly, exposure can be applied in a lump using the MPA to form contact holes 231 to 234.

Subsequently, a conductive film is formed to fill the contact holes 231 to 234 and cover the third interlayer insulating film 230. The conductive film is patterned then by a photolithography step to obtain wirings 235 to 238 which are led out from the third wirings 226 to 229 through the contact holes 231 to 234. The wirings 235 to 238 on the third interlayer insulating film 230 correspond to the fourth wiring. In this manner, a functional circuit using TFTs can be fabricated.

As described above, according to this embodiment mode, the width of the wiring and the diameter of the contact holes on the upper layer side which are formed additionally are formed larger than those on the lower layer side by using an exposure system which meets the desired exposure accuracy. Thus, only a small number of additional steps is required for the achievement of a multi-layer wiring.

Embodiment Mode 3

Figure 10:
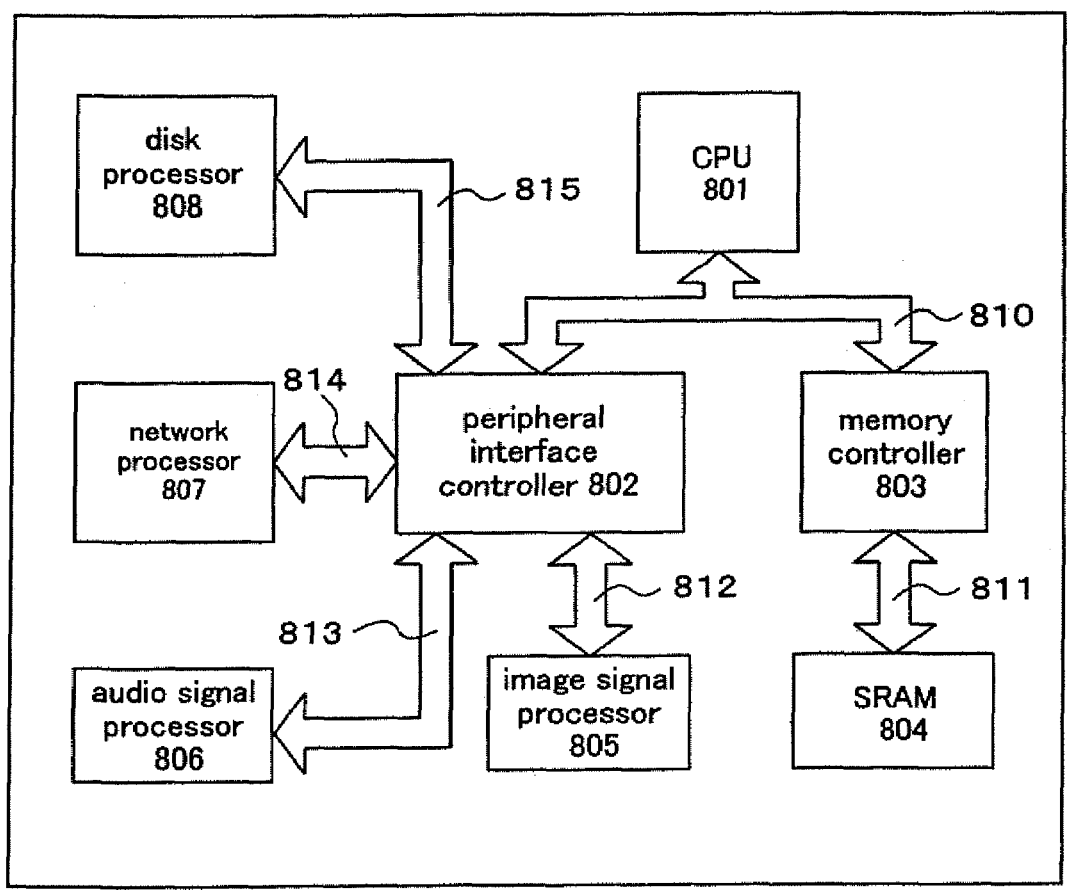
FIG. 10 illustrates a diagram of a wiring board integrating functional circuits.

Described now is another embodiment mode of the invention with reference to FIG. 10. In this embodiment mode, a wiring board in which a number of functional circuits are integrated into one chip with high density is described. FIG. 10 illustrates a conceptual view of a chip in which functional circuits including a CPU 801, a peripheral interface controller 802, a memory controller 803, an SRAM 804, an image signal processor 805, an audio signal processor 806, a network processor 807, a disk processor 808 and the like, each of which has been formed in an individual chip conventionally.

For the functional circuit portion, small area, low power consumption, high operating frequency and the like are required. In the case of constructing each functional circuit with an individual chip, lead wirings between circuits become quite complicated, leading to a large layout area. Thus, it is difficult to operate the wings at high rate. Therefore, it is desirable that all the functional circuits are integrated into one chip, which can be achieved by the method described in this embodiment mode.

In this embodiment mode, the functional circuits including the CPU 801, the peripheral interface controller 802, the memory controller 803, the SRAM 804, the image signal processor 805, the audio signal processor 806, the network processor 807, the disk processor 808 and the like, which are required to have a fine structure are applied with exposure using a reduction type projection exposure system having high resolution and high accuracy of position on a chip-by-chip basis. Patterns are transferred one by one by a step-and-repeat exposure system (stepper) here. As for wirings 810 to 815 and contact holes connecting each functional circuit, on the other hand, conditions regarding resolution and accuracy of position are not very restrictive. Therefore, exposure is applied by using a 1:1 projection exposure system which is capable of applying exposure in a wide-ranging area at one time. Here, an MPA is used to transfer patterns over the entire surface in a lump.

As for an interlayer insulating film in this embodiment mode, organic resin is used. Since organic resin has flatness at the time of deposition, a planarization step can be omitted. However, it is difficult to form a minute contact hole in an organic resin film in terms of the material characteristics and it is thus not suitable for microfabrication. According to this embodiment mode, the width of the wirings and the diameter of contact holes on the upper layer side connected to each functional circuit can be formed large, therefore, less restrictive conditions are given on the microfabrication, and thus organic resin can be effectively used for an interlayer insulating film. According to this embodiment mode, a layout area of the lead wirings can be significantly reduced in the case of integrating functional circuits with high density, which requires a small number of manufacturing steps. Thus, a wiring board having high-performance functional circuits can be provided inexpensively.

Embodiment 1

Figure 5:
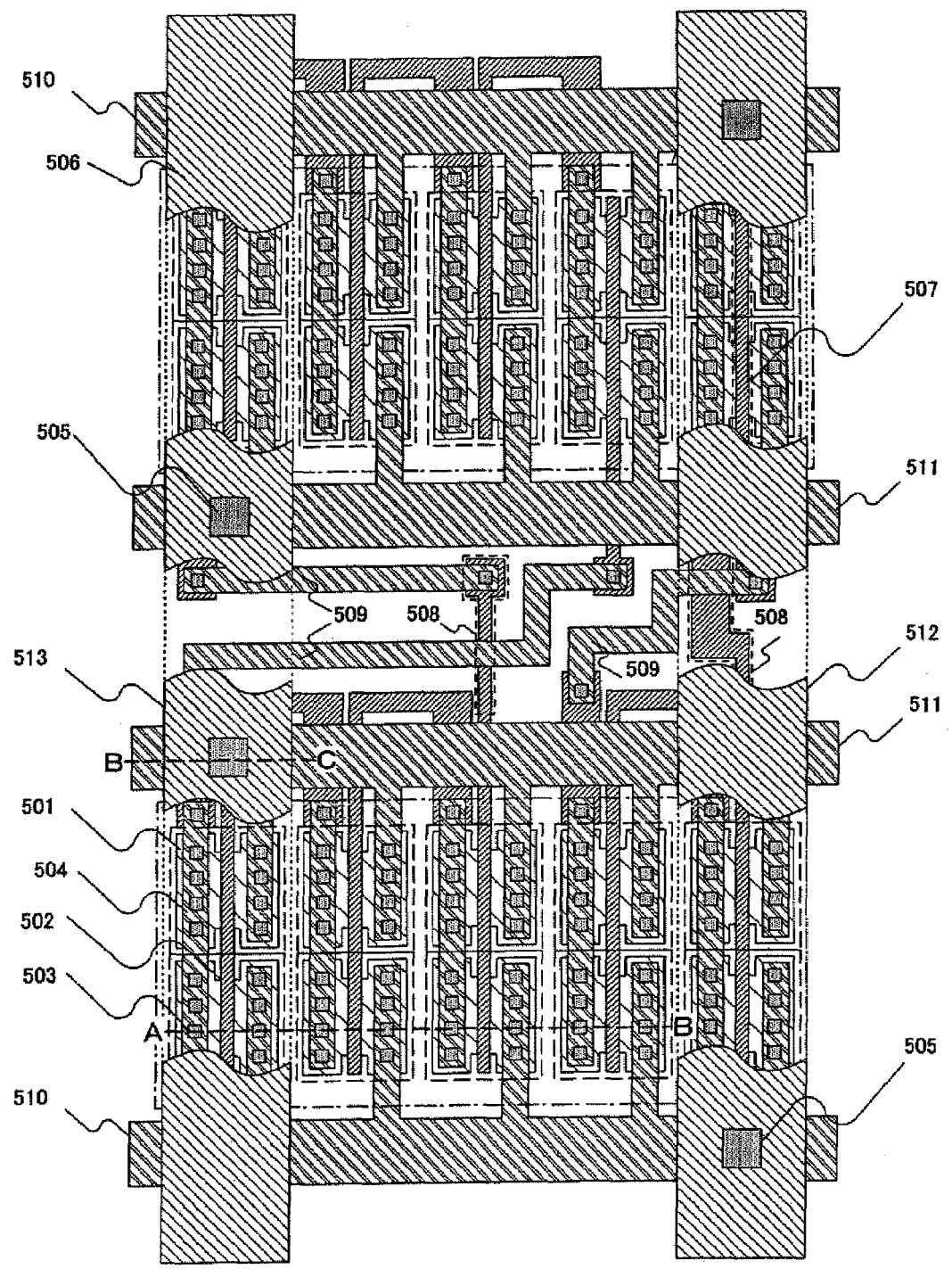
FIG. 5 illustrates a mask layout of a functional circuit of the semiconductor device of the invention.
Figure 6:
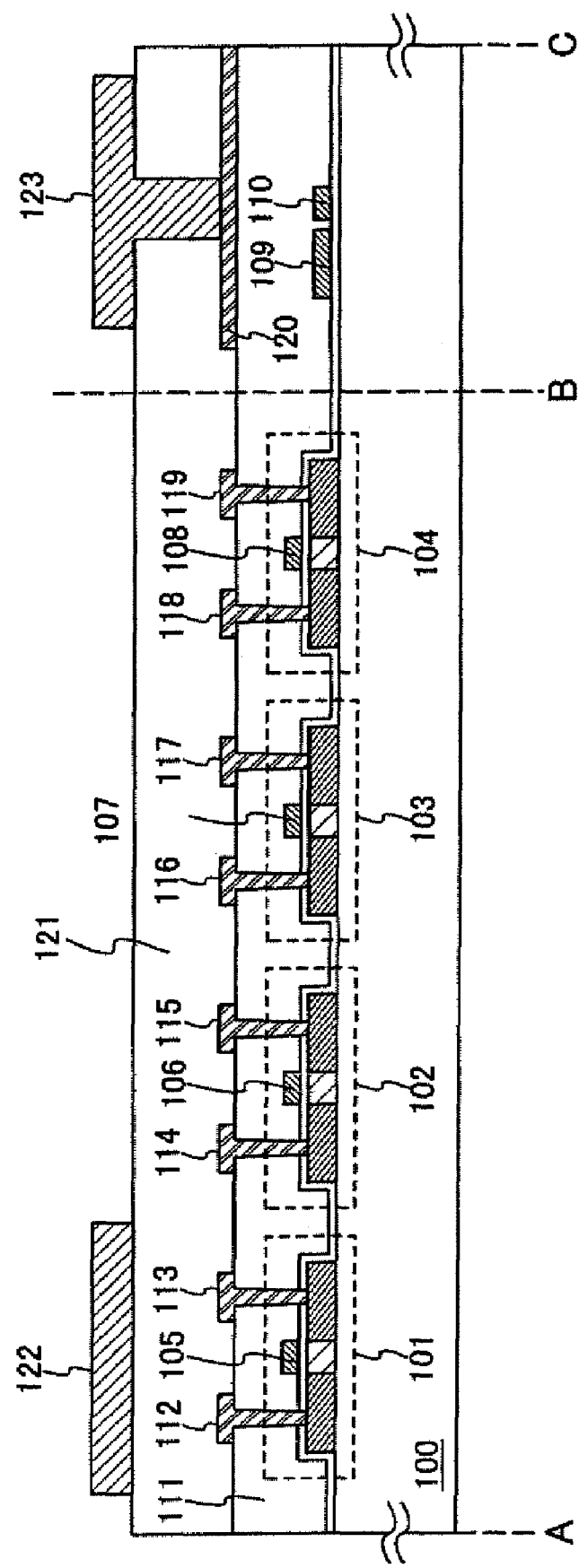
FIG. 6 illustrates a cross sectional view of a functional circuit of the semiconductor device of the invention.

Described now is an embodiment with reference to FIGS. 5 and 6. FIG. 5 is a top view showing an example of a mask layout of a structure of the functional circuit of the invention. FIG. 6 is a part of a cross-sectional view of FIG. 5 taken along lines A-B and B-C. In FIG. 5, a channel forming region, a source region, and a drain region of each TFT are formed in a semiconductor layer 501. A gate wiring 507 and a wiring 508 between TFTs correspond to a first wiring. The first contact hole 503 electrically connects the first wiring to the second wiring or an active layer to the second wiring. A wiring 509 between TFTs, a power supply wiring 510 and a ground wiring 511 correspond to a second wiring 504. The second contact hole 505 electrically connects the second wiring to the third wiring. A power supply wiring 512 and a ground wiring 513 correspond to a third wiring 506.

Lead wirings of TFTs in the functional circuit are formed by the first wiring 502 and the second wiring 504 and the first contact hole 503. Here, a stepper as a system capable of applying exposure in a narrow range with high resolution is used since highly accurate microfabrication is required. Then, another wiring (a third wiring 506) and contact hole (a second contact hole 505) are added. There is an insulating film between the second wiring and the third wiring, and the second and third wirings are electrically connected to each other in the second contact hole 505. The third wiring is used mainly as a wide wiring such as a power supply line. Thus, the second contact hole 505 electrically connects only wide wirings.

By using a wide wiring in the upper layer, the second contact hole can be formed larger in diameter than the first contact hole. In the formation of the wiring and the contact hole in the upper layer, highly accurate microfabrication is not required. Therefore, by using the MPA which is a system capable of applying exposure in a wide range and with low resolution and which can be efficiently used for a large substrate, it becomes possible to perform exposure to the wirings of the functional circuit and the display device or to the contact holes thereof at the same time.

FIG. 6 is a cross-sectional view of FIG. 5. On a substrate 100, thin film transistors 101 to 104 each using a semiconductor layer as an active layer are formed. Over a gate electrode of each transistor, a first interlayer insulating film 111 is formed and contact holes are formed therein. Through the contact holes, a semiconductor layer doped with impurities is electrically connected to second wirings 112 to 119. For forming the contact holes at this time, the stepper as a system capable of applying exposure with high resolution and high accuracy of position is used.

Over the second wirings 112 to 119, a second interlayer insulating film 121 is formed and third wirings 122 and 123 are formed thereon. A second wiring 120 and the third wiring 123 are electrically connected to each other through a contact hole which is formed in the second interlayer insulating film 121. For forming the contact hole at this time, the MPA which is capable of applying exposure in a wide range in a lump is used. According to the multi-layer wiring formation of this embodiment, a layout area of the functional circuit can be reduced, leading to a higher rate operation and higher performance. It should be noted that this embodiment can be implemented in combination with any of the above-described embodiment modes.

Embodiment 2

Figure 4A:
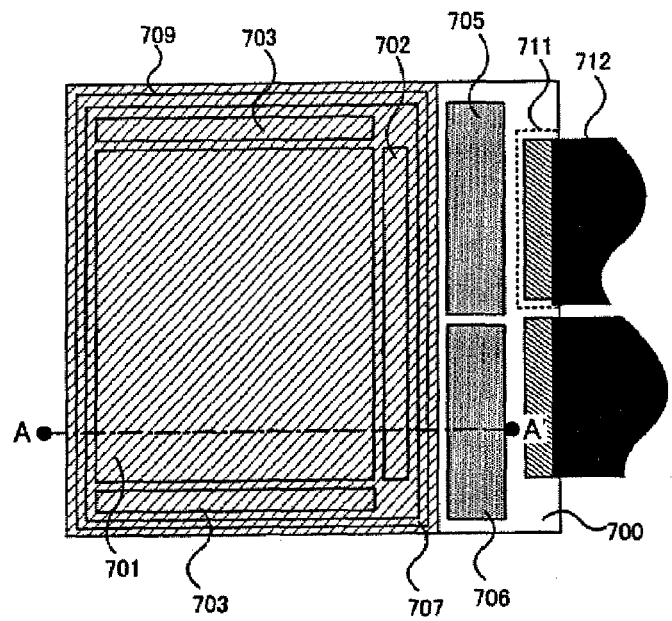
FIGS. 4A and 4B illustrate diagrams of a semiconductor device having a CPU and a memory.
Figure 4B:
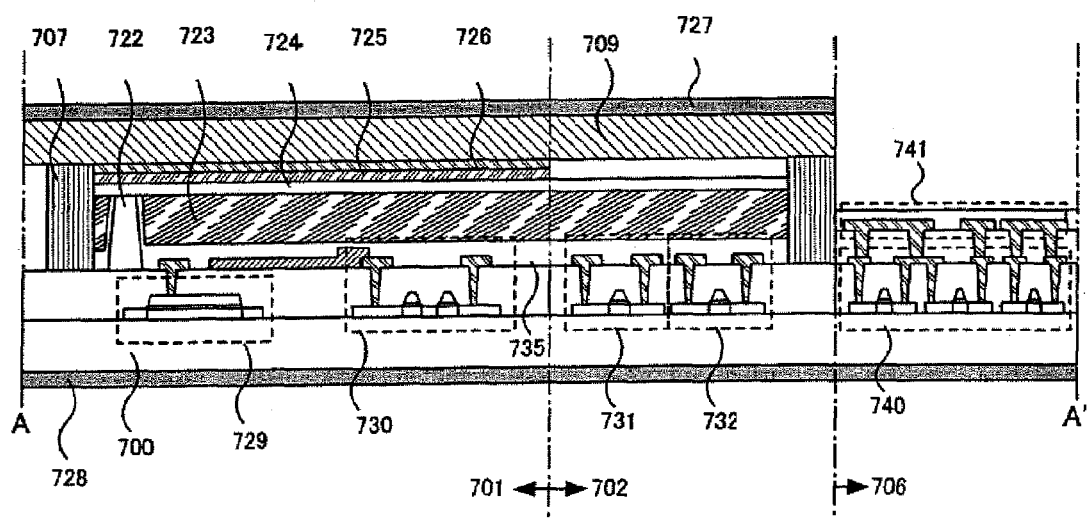

Described with reference to FIGS. 4A and 4B now is a different embodiment from Embodiment 1. In this embodiment, a panel in which a display portion, driver circuits for controlling the display portion, a memory and a CPU on the same surface is described. FIG. 4A is a top plan view of a panel which is formed by sealing liquid crystal with a TFT substrate and a counter substrate and a sealant. FIG. 4B is a cross-sectional view of FIG. 4A taken along a line A-A'.

FIG. 4A is an external view of a panel including a pixel portion 701 in which multiple pixels are arranged in matrix over a substrate 700. Around the pixel portion 701, a signal line driver circuit 702 and a scan line driver circuit 703 for controlling the pixel portion 701 are disposed. A sealant 707 is provided so as to surround all of them. A counter substrate 709 may be provided over only the pixel portion 701, the signal line driver circuit 702 and the scan line driver circuit 703, or over the entire surface. A CPU 706 which may generate heat is preferably disposed to be in contact with a heat sink. A memory 705 may be either a non-volatile memory or a volatile memory. It corresponds to, for example, a flash memory, an SRAM, a DRAM and the like.

FIG. 4B is a cross-sectional view of the panel. The pixel portion 701, the signal line driver circuit 702, and the CPU 706 are formed over the substrate 700. The pixel portion 701 includes a TFT 730 and a storage capacitor 729. The signal line driver circuit 702 includes TFTs 731 and 732. The CPU 706 includes multiple TFTs 740 and wirings 741.

Between the substrate 700 provided with semiconductor elements such as TFTs and the counter substrate 709, a spacer 722 is provided, and these substrates are adhered with the sealant 707. Over the pixel portion 701 and the signal line driver circuit 702, an alignment film 735 processed with rubbing, a liquid crystal layer 723, an alignment film 724, a counter electrode 725 and a color filter 726 are disposed. The substrate 700 and the counter substrate 709 are provided with polarizing plates 727 and 728. The CPU 706 includes a semiconductor element 740 and a wiring 741 stacked thereover.

For the elements configuring the circuits over the substrate 700, polycrystalline semiconductors having higher mobility and larger ON current than those of amorphous semiconductors are used. Therefore, they can be monolithically formed over the same surface. In addition, not only the pixel portion and the driver circuits, but also functional circuits such as a CPU can be integrated over the same substrate 700 by using the manufacturing method of the semiconductor device of the invention. By using the panel the number of external ICs to be connected can be decreased, achieving a compact lightweight and thin panel. This panel is quite effective when applied to a mobile terminal which is making a rapid advance in recent years.

For the CPU 706 and the memory 705, small circuit area, low power consumption, high operating frequency and the like are required. In the case of realizing such high-performance functional circuits, quite complicated lead wirings are required between TFTs, leading to an extremely large layout area of the lead wirings between TFTs. Thus, the CPU 706 and the memory 705 are formed to have a multi-layer wiring structure so as to achieve reduction in area of the whole functional circuit.

As for the formation of contact holes in the pixel portion 701 and the signal line driver circuit 702 in this embodiment, conditions regarding the accuracy of position are not restrictive. Therefore, exposure is applied in a lump with the MPA as a system capable of applying exposure in a wide range. As for the formation of contact holes in the CPU 706, on the other hand, high accuracy of position is required, thus exposure is applied with the stepper as an exposure system enabling high resolution. In addition, as for the formation of contact holes in a wiring in upper layers, conditions regarding the accuracy of position are not restrictive. Therefore, exposure is applied in a lump with the MPA as a system capable of applying exposure in a wide range.

Although semiconductor elements are formed in the first layer and the wirings are stacked thereover in this embodiment, the invention is not limited to this configuration. It is also possible to stack semiconductor elements in plural layers and stack wirings thereover. Alternatively, by means of peeling, semiconductor elements formed over another substrate may be peeled off and attached to a desired substrate, stacking wirings thereover.

Although a panel using liquid crystal elements as display elements is employed in this embodiment, the invention is not limited to this embodiment. For example, a panel using other display elements such as light emitting elements can be used. According to this embodiment mode, even in the case of achieving a multi-layer wiring with a small number of steps, and integrating a display device and a functional circuit on the same substrate, a high-performance functional circuit can be mounted in a small area.

Embodiment 3

Described in this embodiment with reference to FIGS. 7A to 7G are examples of electronic apparatuses which are manufactured according to the invention.

Electronic apparatuses manufactured according to the invention include a video camera, a digital camera, a goggle type display (head mounted display), a navigation system, a sound reproducing device (car audio set, component stereo and the like), a laptop personal computer, a video game machine, a portable information terminal (mobile computer, mobile phone, portable game machine and the like), an image reproducing device provided with a recording medium (specifically, a device reproducing a recording medium such as a DVD (Digital Versatile Disc) and displaying the reproduced image) and the like. Specific examples of these electronic apparatuses are shown in FIGS. 7A to 7G.

Figure 7A:
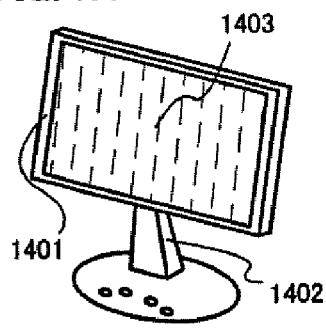
FIGS. 7A to 7G illustrate views of electronic apparatuses using the semiconductor device of the invention.

FIG. 7A is a display device including a housing 1401, a supporting base 1402, a display portion 1403 and the like. The invention can be applied to the display portion 1403 of the display device. By using the invention, a compact and lightweight display device can be achieved.

Figure 7C:
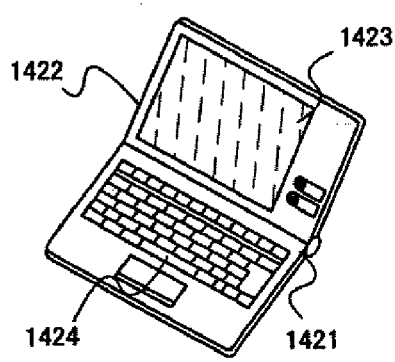
Figure 7E:
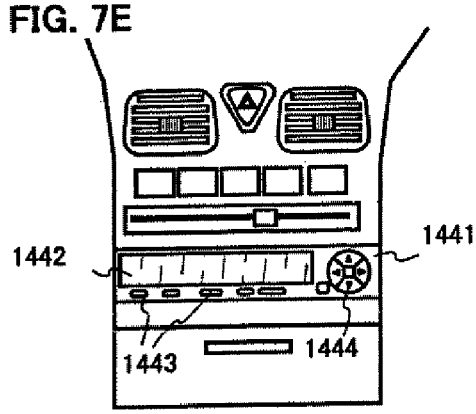
Figure 7F:
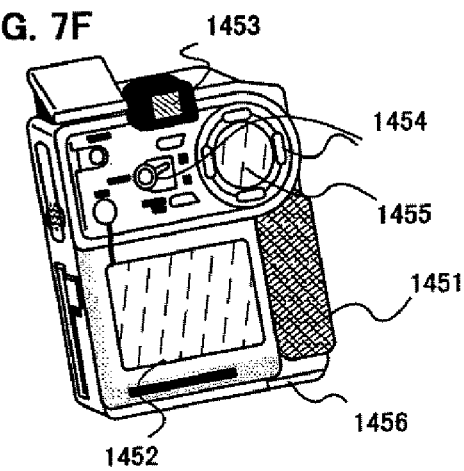
Figure 7B:
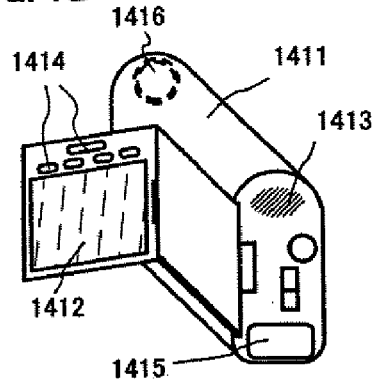

FIG. 7B is a video camera including a main body 1411, a display portion 1412, an audio input portion 1413, operating switches 1414, a battery 1415, an image receiving portion 1416 and the like. The invention can be applied to the display portion 1412 of the video camera. By using the invention, a compact and lightweight video camera can be achieved.

FIG. 7C is a laptop personal computer including a main body 1421, a housing 1422, a display portion 1423, a keyboard 1424 and the like. The invention can be applied to the display portion 1423 of the laptop personal computer. In addition, the invention can be applied to a semiconductor device such as a CPU and a memory in the main body 1421. By using the invention, a compact and lightweight laptop personal computer can be achieved.

Figure 7D:
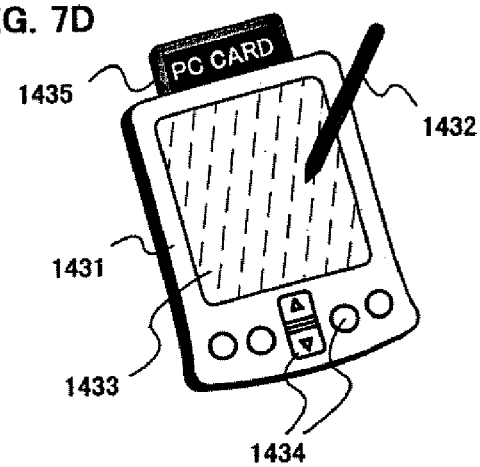

FIG. 7D is a portable information terminal including a main body 1431, a stylus 1432, a display portion 1433, operating switches 1434, an external interface 1435 and the like. The invention can be applied to the display portion 1433 of the portable information terminal. In addition, the invention can be applied to a semiconductor device such as a CPU and a memory in the main body 1431. By using the invention, a compact and lightweight portable information terminal can be achieved.

FIG. 7E is a sound reproducing device, specifically a car audio set including a main body 1441, a display portion 1442, operating switches 1443 and 1444 and the like. The invention can be applied to the display portion 1442 of the car audio set. In addition, the invention can be applied to a semiconductor device such as a CPU and a memory in the main body 1441. Alternatively, the sound reproducing device can be applied to a portable or a home audio set although the car audio set is taken as an example here. By using the invention, a compact and lightweight sound reproducing device can be achieved.

FIG. 7F is a digital camera including a main body 1451, a display portion A1452, an eyepiece portion 1453, operating switches 1454, a display portion B1455, a battery 1456 and the like. The invention can be applied to the display portions A1452 and B1455 of the digital camera. In addition, the invention can be applied to a semiconductor device such as a CPU and a memory in the main body 1451. By using the invention, a compact and lightweight digital camera can be achieved.

Figure 7G:
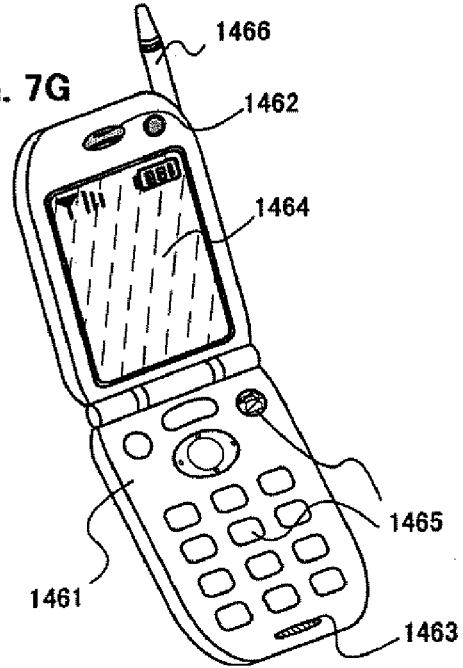
Figure 8:
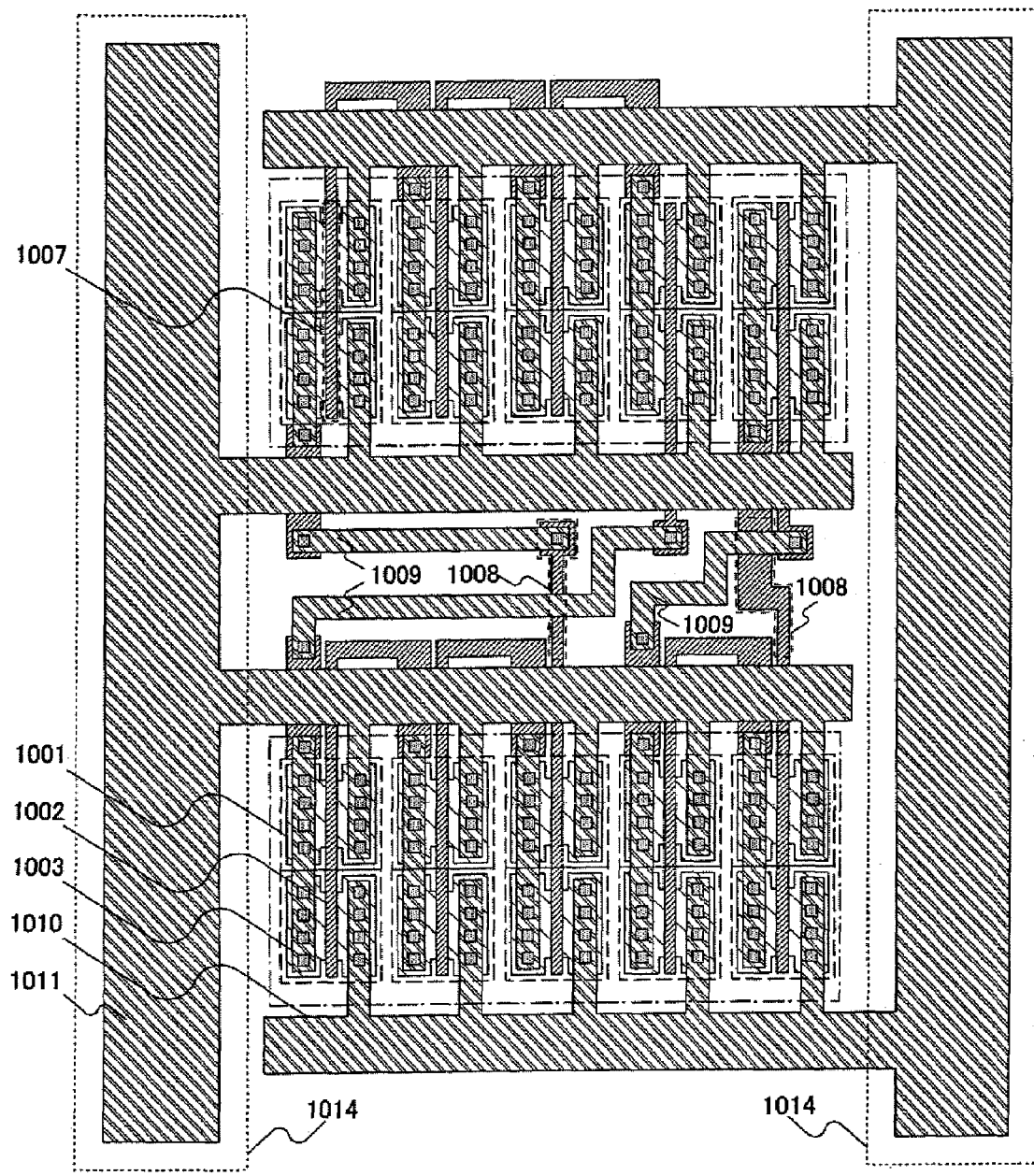
FIG. 8 illustrates a mask layout of a functional circuit of a conventional semiconductor device.

FIG. 7G is a mobile phone including a main body 1461, an audio output portion 1462, an audio input portion 1463, a display portion 1464, operating switches 1465, an antenna 1466 and the like. The invention can be applied to the display portion 1464 of the mobile phone. In addition, the invention can be applied to a semiconductor device such as a CPU and a memory in the main body 1461. By using the invention, a compact and lightweight mobile phone can be achieved.

For the semiconductor device used for these electronic apparatuses, not only a glass substrate but also a thermostable plastic substrate can be used. Accordingly, the electronic apparatuses can be formed even more compact.

The invention is not limited to the above electronic apparatuses. It can be applied to various electronic apparatuses using the semiconductor device shown in any of Embodiment Mode 1 or Embodiment Mode 2. This embodiment can be implemented in any combination with the above embodiment modes and embodiments.

This application is based on Japanese Patent Application serial no. 2003-287206 filed in Japan Patent Office on Aug. 5, 2003, the contents of which are hereby incorporated by reference. Although the invention has been fully described by way of Embodiment Modes and Embodiments with reference to the accompanying drawings, it is to be understood that various changes and modifications will be apparent to those skilled in the art. Therefore, unless such changes and modifications depart from the scope of the invention hereinafter defined, they should be constructed as being included therein.

What is claimed is:

1. A manufacturing method of a wiring board, comprising:
    forming a first wiring over a substrate having an insulating surface;
    forming a first interlayer insulating film over the first wiring;
    forming a first contact hole in the first interlayer insulating film;
    forming a second wiring over the first interlayer insulating film so as to be electrically connected to the first wiring through the first contact hole;
    forming a second interlayer insulating film over the second wiring;
    forming a second contact hole in the second interlayer insulating film; and
    forming a third wiring over the second interlayer insulating film so as to be electrically connected to at least one of the first and second wirings through the second contact hole,
    wherein the first to third wirings and the first and second contact holes are formed by first to fifth photolithography steps respectively; and
    wherein at least one of the first to fifth photolithography steps is performed by a different exposure system from that of the other photolithography steps.

2. A manufacturing method of a wiring board, comprising:
    forming first to n-th ($n \geq 3$) wirings, first to (n−1)-th interlayer insulating films, and first to (n−1)-th contact holes over a substrate having an insulating surface,
    wherein an m-th ($1 \leq m \leq (n-2)$) interlayer insulating film is formed over an m-th wiring;
    wherein an m-th contact hole is formed in the m-th interlayer insulating film;
    wherein an (m+1)-th wiring is formed over the m-th interlayer insulating film so as to be electrically connected to at least one of the first to m-th wirings through the m-th contact hole;
    wherein an (m+1)-th interlayer insulating film is formed over the (m+1)-th wiring;
    wherein an (m+1)-th contact hole is formed in the (m+1)-th interlayer insulating film;
    wherein an (m+2)-th wiring is formed over the (m+1)-th interlayer insulating film so as to be electrically connected to at least one of the first to (m+1)-th wirings through the (m+1)-th contact hole;
    wherein the first to n-th wirings and the first to (n−1)-th contact holes are formed by first to (2n−1)-th photolithography steps respectively; and
    wherein at least one of the first to (2n−1)-th photolithography steps is performed by a different exposure system from that of the other photolithography steps.

3. The manufacturing method of a wiring board according to claim 1, wherein the exposure system which is different from the rest of the exposure systems is a system which can apply exposure with higher resolution, higher accuracy of position and in a narrower range of exposure as compared to the other exposure systems.

4. The manufacturing method of a wiring board according to claim 2, wherein the exposure system which is different from the rest of the exposure systems is a system which can apply exposure with higher resolution, higher accuracy of position and in a narrower range of exposure as compared to the other exposure systems.

5. The manufacturing method of a wiring board according to claim 1, wherein at least one of the exposure systems is a lens projection exposure system.

6. The manufacturing method of a wiring board according to claim 2, wherein at least one of the exposure systems is a lens projection exposure system.

7. The manufacturing method of a wiring board according to claim 1, wherein at least one of the exposure systems is a mirror projection exposure system.

8. The manufacturing method of a wiring board according to claim 2, wherein at least one of the exposure systems is a mirror projection exposure system.

9. The manufacturing method of a wiring board according to claim 1, wherein wirings in upper layers of the first to third wirings are formed wider than wirings in lower layer, and the second contact hole is formed larger in diameter than the first contact hole.

10. The manufacturing method of a wiring board according to claim 2, wherein wirings in upper layers of the first to n-th wirings are formed wider than wirings in lower layer, and contact holes in upper layers of the first to (n−1)-th contact holes are formed larger in diameter than contact holes in lower layers.

11. The manufacturing method of a wiring board according to claim 1, wherein the first to third wirings are formed of a film including one or more of Al, W, Mo, Ti, Pt, Cu, Ta and Au in single or multiple layers, or a semiconductor thin film doped with impurities.

12. The manufacturing method of a wiring board according to claim 2, wherein the first to n-th wirings are formed of a film including one or more of Al, W, Mo, Ti, Pt, Cu, Ta and Au in single or multiple layers, or a semiconductor thin film doped with impurities.

13. The manufacturing method of a wiring board according to claim 1, wherein at least one of the first to third wirings is used as one of a power supply wiring and a clock wiring.

14. The manufacturing method of a wiring board according to claim 2, wherein at least one of the first to n-th wirings is used as one of a power supply wiring and a clock wiring.

15. The manufacturing method of a wiring board according to claim 1, wherein at least one of the first and second interlayer insulating films comprises organic resin.

16. The manufacturing method of a wiring board according to claim 2, wherein at least one of the first to (n−1)-th interlayer insulating films comprises organic resin.

17. The manufacturing method of a wiring board according to claim 1, wherein wirings in upper layers of the first to third wirings are formed wider than wirings in lower layer, and the second contact hole is formed lager in area than the first contact hole.

18. The manufacturing method of a wiring board according to claim 2, wherein wirings in upper layers of the first to n-th wirings are formed wider than wirings in lower layer, and contact holes in upper layers of the first to (n−1)-th contact holes are formed larger in area than contact holes in lower layers.

19. A manufacturing method of a semiconductor device comprising a functional circuit, comprising:
    forming a first wiring;
    forming a first interlayer insulating film over the first wiring;
    forming a first contact hole in the first interlayer insulating film;
    forming a second wiring over the first interlayer insulating film so as to be electrically connected to the first wiring through the first contact hole;

forming a second interlayer insulating film over the second wiring;

forming a second contact hole in the second interlayer insulating film; and forming a third wiring over the second interlayer insulating film so as to be electrically connected to at least one of the first and second wirings through the second contact hole, wherein the first to third wirings and the first and second contact holes are formed by first to fifth photolithography steps respectively; and wherein at least one of the first to fifth photolithography steps is performed by a different exposure system from that of the other photolithography steps.

20. A manufacturing method of a semiconductor device comprising a functional circuit, comprising:

forming first to n-th (n≧3) wirings, first to (n−1)-th interlayer insulating films, and first to (n−1)-th contact holes, wherein an m-th (1≦m≦(n−2)) interlayer insulating film is formed over an m-th wiring;

wherein an m-th contact hole is formed in the m-th interlayer insulating film;

wherein an (m+1)-th wiring is formed over the m-th interlayer insulating film so as to be electrically connected to at least one of the first to m-th wirings through the m-th contact hole;

wherein an (m+1)-th interlayer insulating film is formed over the (m+1)-th wiring;

wherein an (m+1)-th contact hole is formed in the (m+1)-th interlayer insulating film;

wherein an (m+2)-th wiring is formed over the (m+1)-th interlayer insulating film so as to be electrically connected to at least one of the first to (m+1)-th wirings through the (m+1)-h contact hole;

wherein the first to n-th wirings and the first to (n−1)-th contact holes are formed by first to (2n−1)-th photolithography steps respectively; and wherein at least one of the first to (2n−1)-th photolithography steps is performed by a different exposure system from that of the other photolithography steps.

21. The manufacturing method of a semiconductor device according to claim 19, wherein a display device is integrated with the functional circuit over the same substrate.

22. The manufacturing method of a semiconductor device according to claim 20, wherein a display device is integrated with the functional circuit over the same substrate.

23. The manufacturing method of a semiconductor device according to claim 19, wherein the exposure system which is different from that of the other photolithography steps is a system which can apply exposure with higher resolution, higher accuracy of position and in a narrower range of exposure as compared to that of the photolithography steps.

24. The manufacturing method of a semiconductor device according to claim 20, wherein the exposure system which is different from that of the other photolithography steps is a system which can apply exposure with higher resolution, higher accuracy of position and in a narrower range of exposure as compared to that of the photolithography steps.

25. The manufacturing method of a semiconductor device according to claim 19, wherein at least one of the exposure systems is a lens projection exposure system.

26. The manufacturing method of a semiconductor device according to claim 20, wherein at least one of the exposure systems is a lens projection exposure system.

27. The manufacturing method of a semiconductor device according to claim 19, wherein at least one of the exposure systems is a mirror projection exposure system.

28. The manufacturing method of a semiconductor device according to claim 20, wherein at least one of the exposure systems is a mirror projection exposure system.

29. The manufacturing method of a semiconductor device according to claim 21, wherein the exposure system used for forming each of the first to third wirings and the first and second contact holes of the functional circuit is a system which can apply exposure with higher resolution, higher accuracy of position and in a narrower range of exposure as compared to an exposure system used for forming each of wirings and contact holes of the display device.

30. The manufacturing method of a semiconductor device according to claim 22, wherein the exposure system used for forming each of the first to n-th wirings and the first to (n−2)-th contact holes of the functional circuit is a system which can apply exposure with higher resolution, higher accuracy of position and in a narrower range of exposure as compared to an exposure system used for forming each of wirings and contact holes of the display device.

31. The manufacturing method of a semiconductor device according to claim 19, wherein the wirings in the upper layers of the first to third wirings are formed wider than the wirings in the lower layers, and the second contact hole is formed larger in diameter than the first contact hole.

32. The manufacturing method of a semiconductor device according to claim 20, wherein the wirings in the upper layers of the first to n-th wirings are formed wider than the wirings in the lower layers, and the contact holes in the upper layers of the first to (n−1)-th contact holes are formed larger in diameter than the contact holes in the lower layers.

33. The manufacturing method of a semiconductor device according to claim 19, wherein the functional circuit is one selected from the group consisting of a CPU, an image signal processing circuit, an SRAM and a DRAM.

34. The manufacturing method of a semiconductor device according to claim 20, wherein the functional circuit is one selected from the group consisting of a CPU, an image signal processing circuit, an SRAM and a DRAM.

35. The manufacturing method of a semiconductor device according to claim 19, wherein the first to third wirings are formed of a film including one or more of Al, W, Mo, Ti, Pt, Cu, Ta and Au in single or multiple layers, or a semiconductor thin film doped with impurities.

36. The manufacturing method of a semiconductor device according to claim 20, wherein the first to n-th wirings are formed of a film including one or more of Al, W, Mo, Ti, Pt, Cu, Ta and Au in single or multiple layers, or a semiconductor thin film doped with impurities.

37. The manufacturing method of a semiconductor device according to claims 19, wherein at least one of the first to third wirings is used as one of a power supply wiring and a clock wiring.

38. The manufacturing method of a semiconductor device according to claim 20, wherein at least one of the first to n-th wirings is used as one of a power supply wiring and a clock wiring.

39. The manufacturing method of a semiconductor device according to claim 19, wherein at least one of the first and second interlayer insulating films comprises organic resin.

40. The manufacturing method of a semiconductor device according to claim 20, wherein at least one of the first to (n−1)-th interlayer insulating films comprises organic resin.

41. The manufacturing method of a semiconductor device according to claim 19, wherein the wirings in the upper layers of the first to third wirings are formed wider than the wirings in the lower layers, and the second contact hole is formed larger in area than the first contact hole.

42. The manufacturing method of a semiconductor device according to claim 20, wherein the wirings in the upper layers of the first to n-th wirings are formed wider than the wirings in the lower layers, and the contact holes in the upper layers of the first to (n−1)-th contact holes are formed larger in area than the contact holes in the lower layers.

* * * * *